United States Patent
Pritchard et al.

(10) Patent No.: US 7,955,919 B2
(45) Date of Patent: Jun. 7, 2011

(54) SPACER-LESS TRANSISTOR INTEGRATION SCHEME FOR HIGH-K GATE DIELECTRICS AND SMALL GATE-TO-GATE SPACES APPLICABLE TO SI, SIGE AND STRAINED SILICON SCHEMES

(75) Inventors: David Pritchard, Portland, OR (US); Hemanshu Bhatt, Vancouver, WA (US); David T. Price, Gresham, OR (US)

(73) Assignee: LSI Corporation, Milpitas, CA (US)

( * ) Notice: Subject to any disclaimer, the term of this patent is extended or adjusted under 35 U.S.C. 154(b) by 70 days.

(21) Appl. No.: 11/960,554

(22) Filed: Dec. 19, 2007

(65) Prior Publication Data

US 2008/0102583 A1 May 1, 2008

Related U.S. Application Data

(62) Division of application No. 10/791,337, filed on Mar. 1, 2004, now abandoned.

(51) Int. Cl.
*H01L 21/336* (2006.01)

(52) U.S. Cl. .. 438/197; 438/291; 438/301; 257/E21.429

(58) Field of Classification Search ............... 438/270, 438/197, 301, 290, 291; 257/E21.429
See application file for complete search history.

(56) References Cited

U.S. PATENT DOCUMENTS

| | | | |
|---|---|---|---|
| 5,571,738 A * | 11/1996 | Krivokapic | 438/291 |
| 6,037,216 A * | 3/2000 | Liu et al. | 438/253 |
| 6,054,355 A | 4/2000 | Inumiya et al. | |
| 6,406,950 B1 | 6/2002 | Dakshina-Murthy | |
| 6,501,131 B1 | 12/2002 | Divakaruni et al. | |
| 6,645,818 B1 | 11/2003 | Sing et al. | |
| 6,680,496 B1 | 1/2004 | Hammond et al. | |
| 6,759,695 B2 | 7/2004 | Ma et al. | |
| 6,803,318 B1 | 10/2004 | Qiao et al. | |
| 6,841,430 B2 | 1/2005 | Sugawara et al. | |
| 2003/0119269 A1 * | 6/2003 | Kim | 438/306 |

OTHER PUBLICATIONS

Office Action Dated Nov. 30, 2005 of U.S. Appl. No. 10/791,337.
Office Action Dated May 22, 2006 of U.S. Appl. No. 10/791,337.
Office Action Dated Sep. 11, 2006 of U.S. Appl. No. 10/791,337.
Office Action Dated Nov. 8, 2006 of U.S. Appl. No. 10/791,337.
Office Action Dated Apr. 4, 2007 of U.S. Appl. No. 10/791,337.
Office Action Dated Aug. 27, 2007 of U.S. Appl. No. 10/791,337.

* cited by examiner

*Primary Examiner* — Michael Trinh
(74) *Attorney, Agent, or Firm* — Beyer Law Group LLP

(57) ABSTRACT

A transistor integration process provides a damascene method for the formation of gate electrodes and gate dielectric layers. An interlayer-dielectric film is deposited prior to the gate electrode formation to avoid the demanding gap fill requirements presented by adjacent gates. A trench is formed in the interlayer-dielectric film followed by the deposition of the gate material in the trench. This process avoids the potential for damage to high-k gate dielectric layers caused by high thermal cycles and also reduces or eliminates the problematic formation of voids in the dielectric layers filling the gaps between adjacent gates.

21 Claims, 9 Drawing Sheets

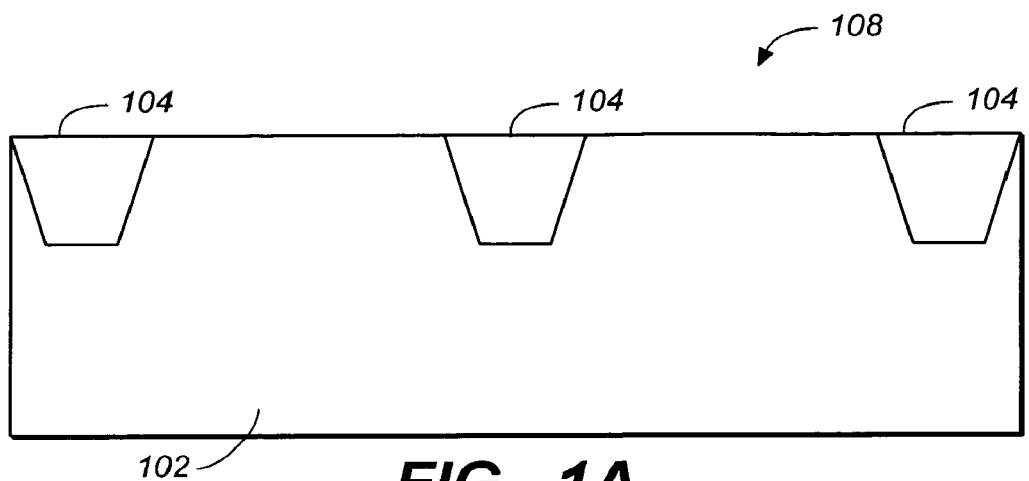
FIG._1A
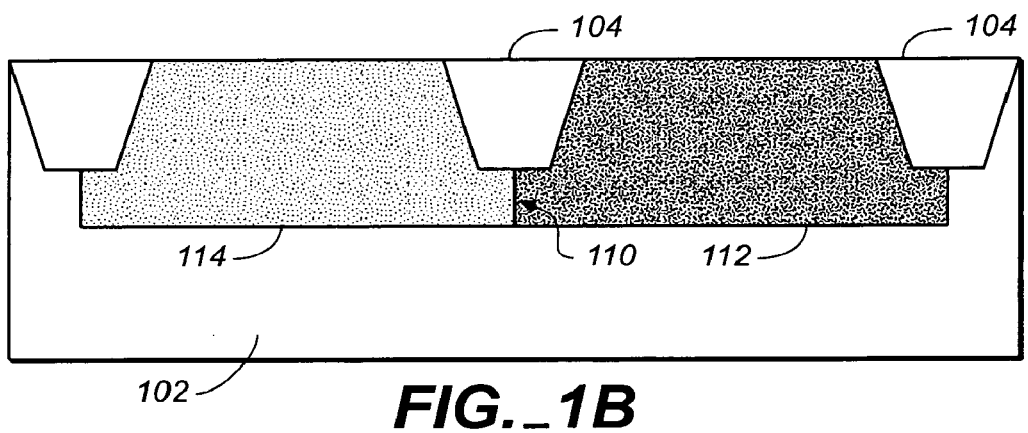
FIG._1B
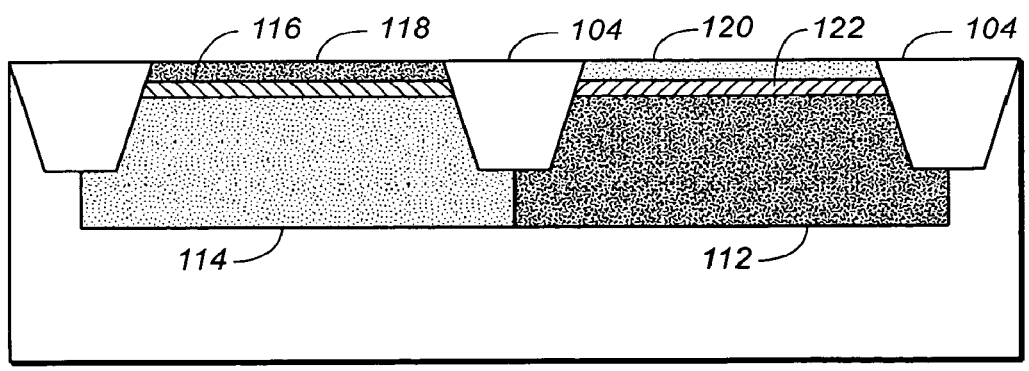
FIG._1C

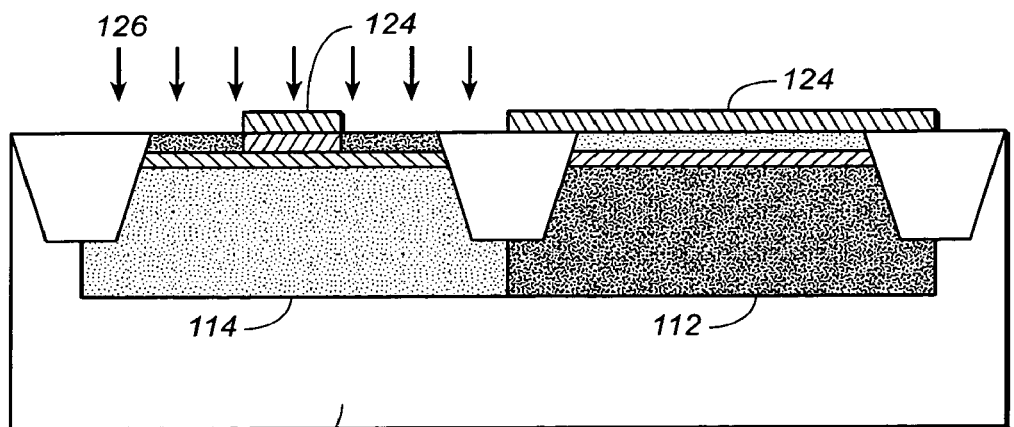
FIG._1D
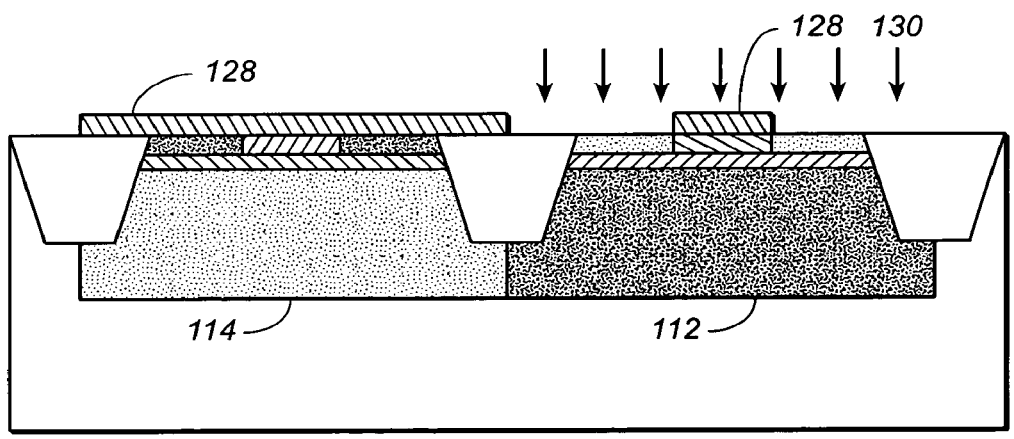
FIG._1E
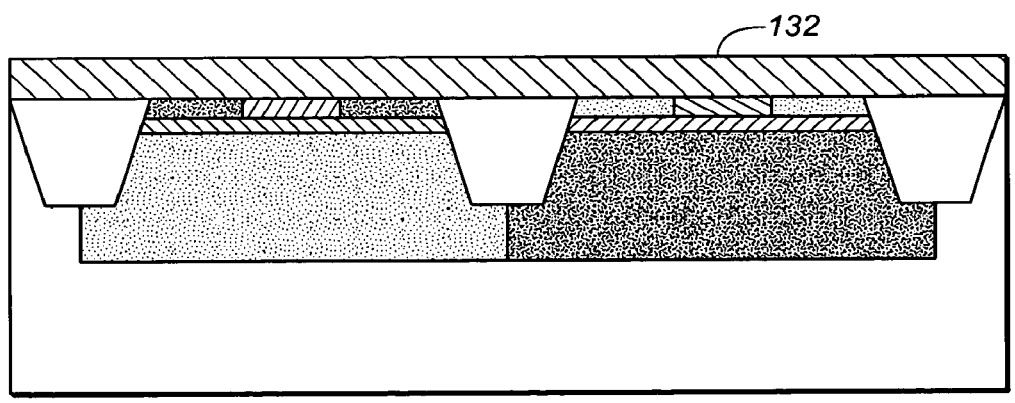
FIG._1F

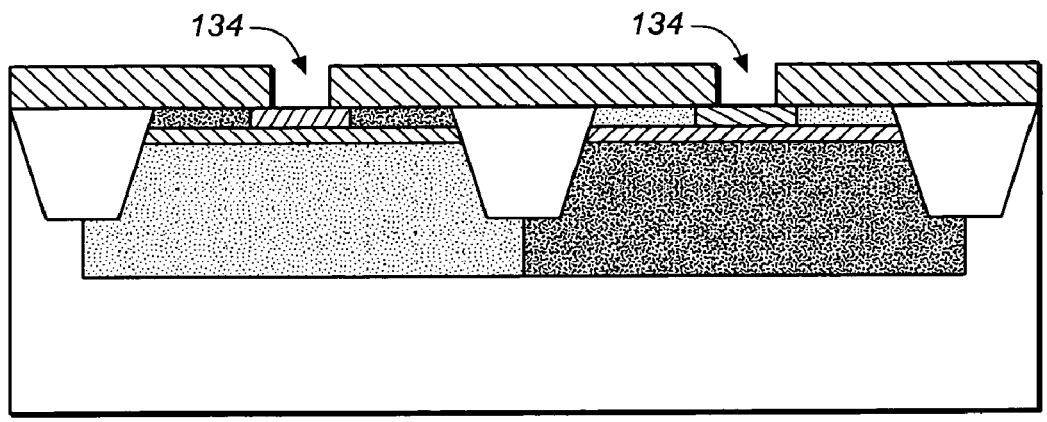
FIG._1G
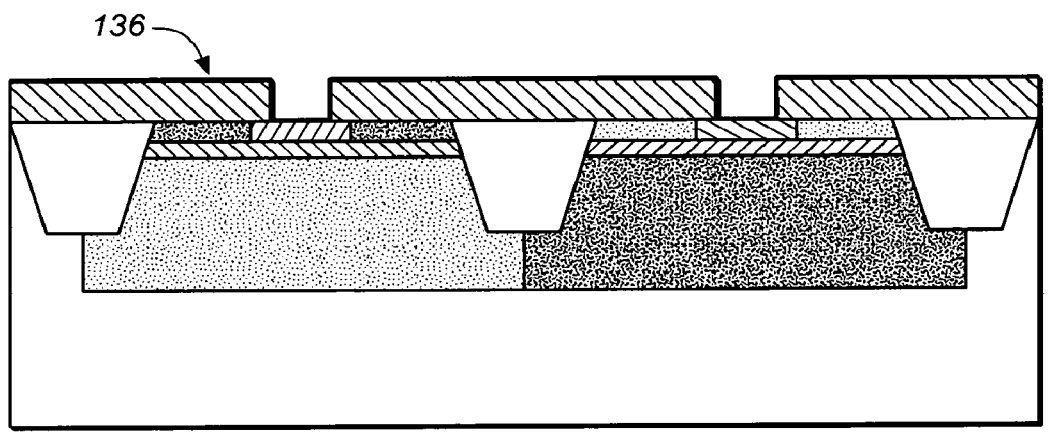
FIG._1H
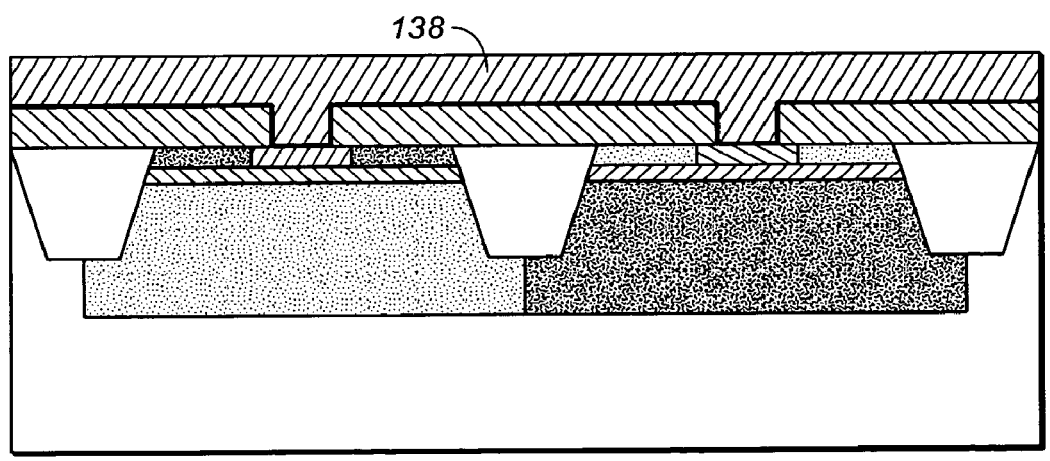
FIG._1I

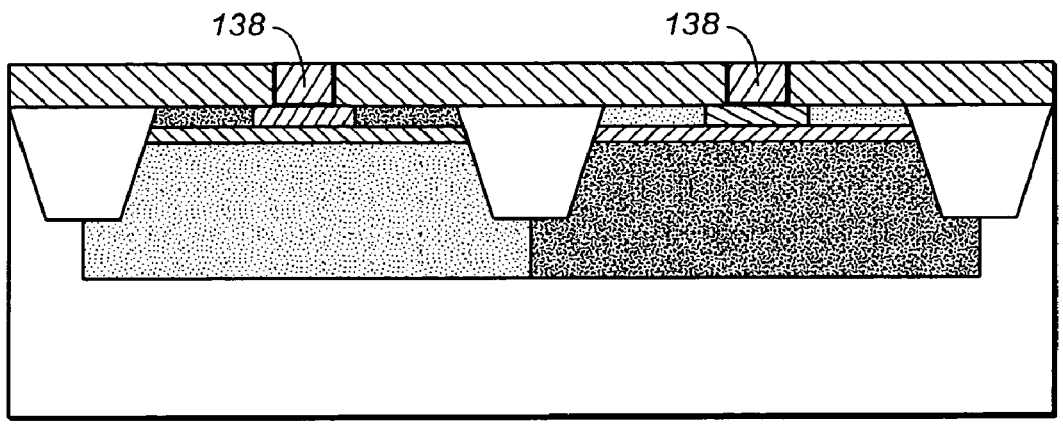
FIG._1J
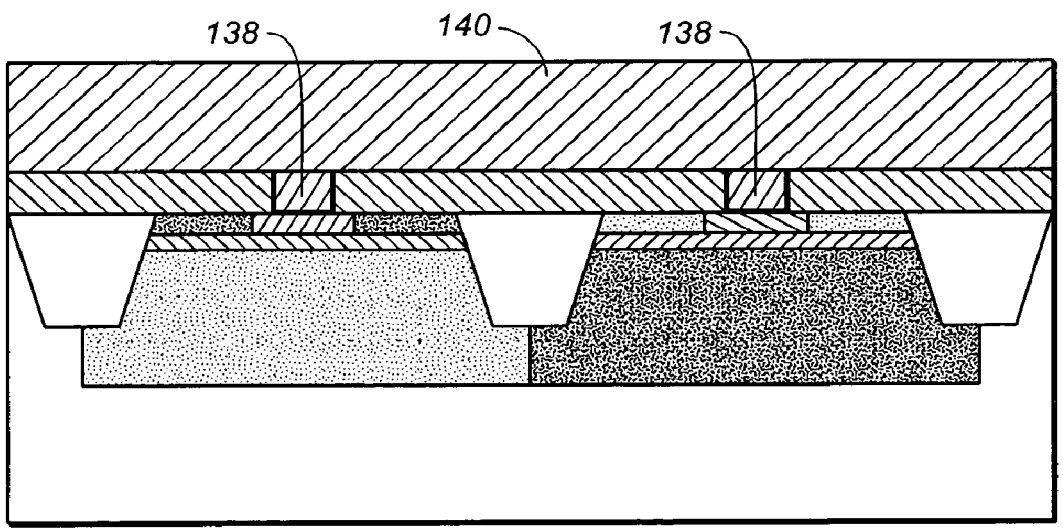
FIG._1K

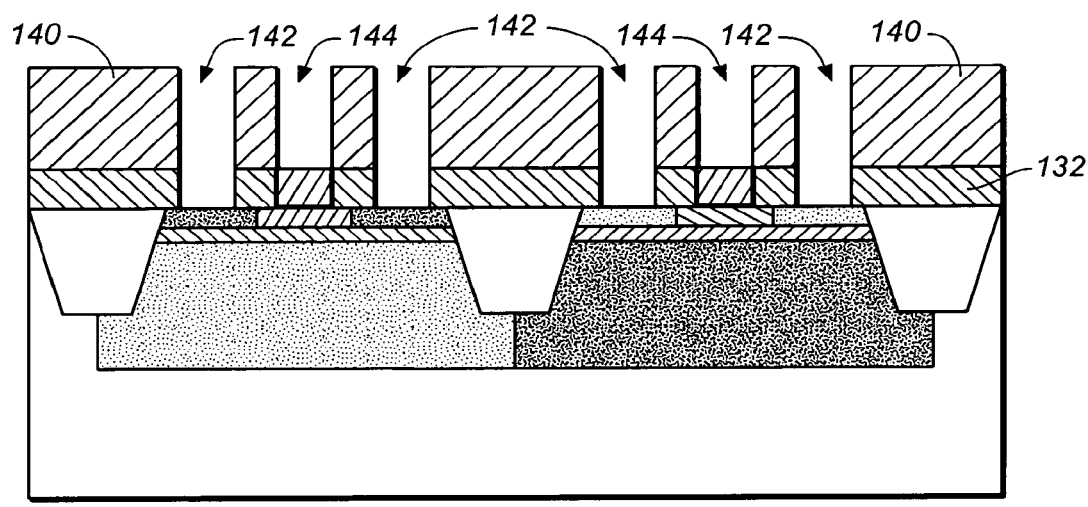
FIG._1L
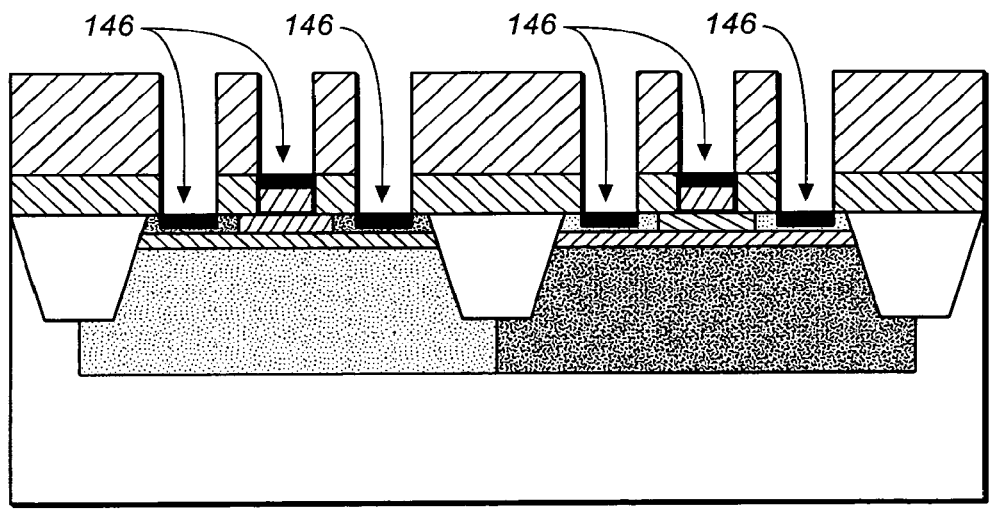
FIG._1M

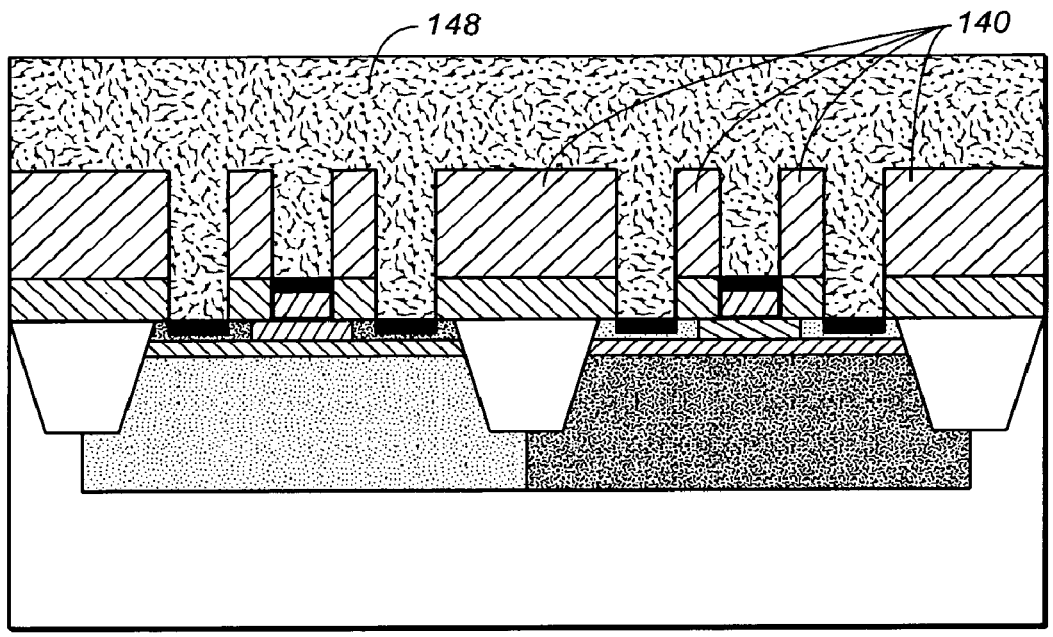
FIG._1N
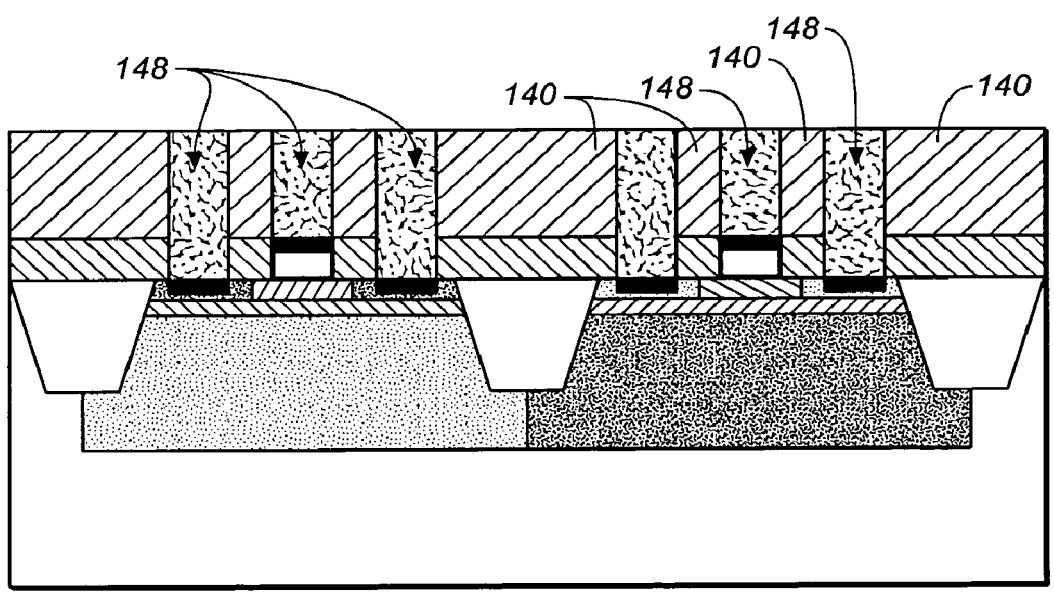
FIG._1O

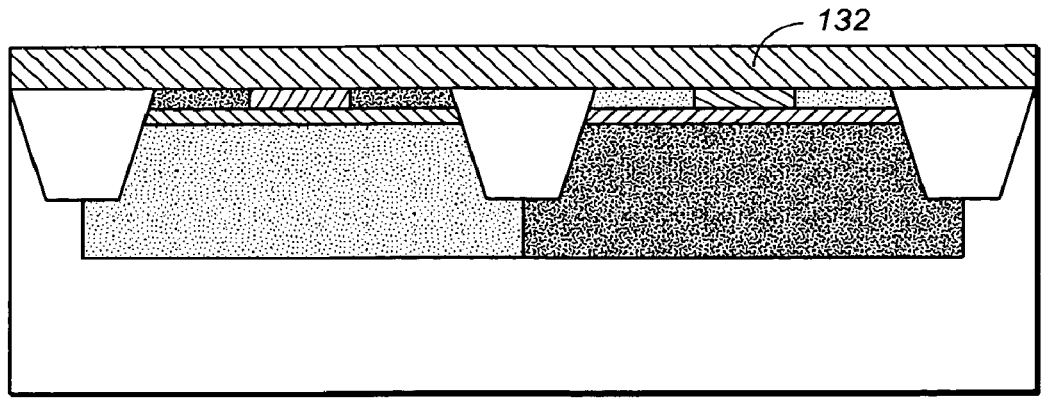
*FIG._2A*
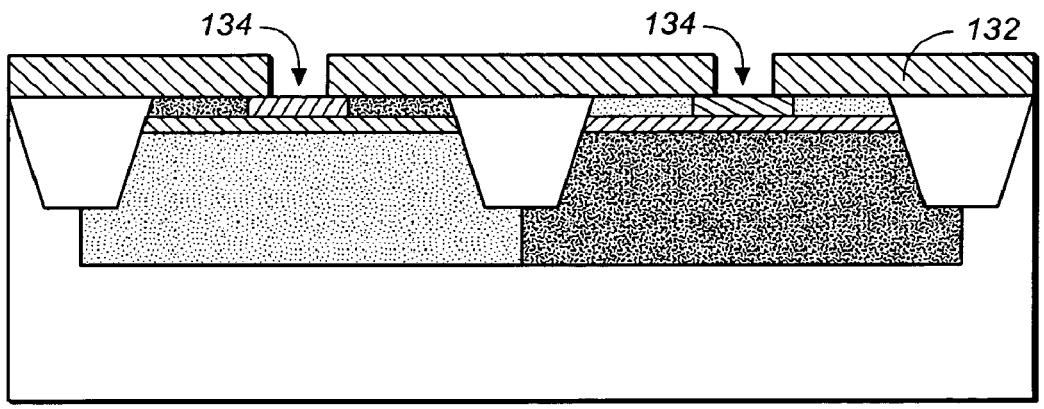
*FIG._2B*
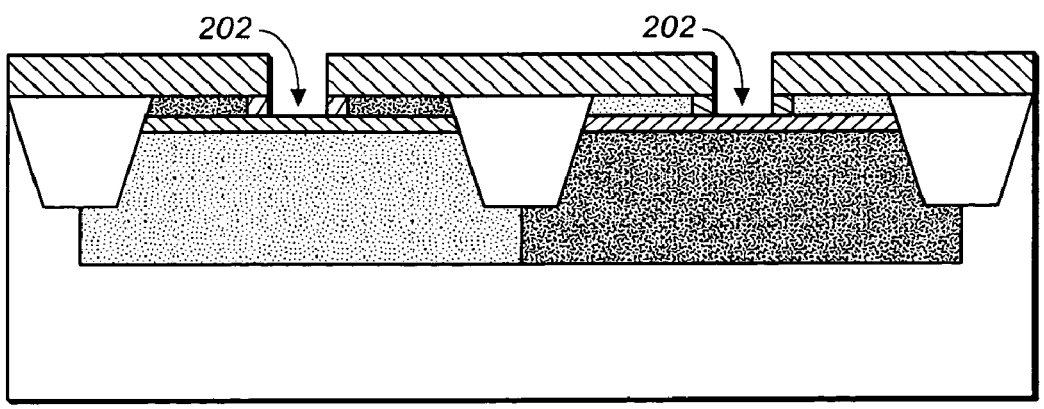
*FIG._2C*

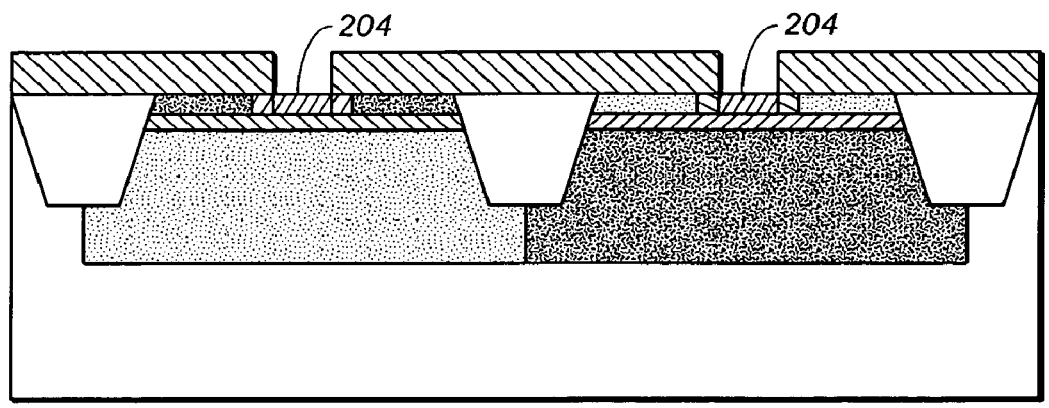
*FIG._2D*
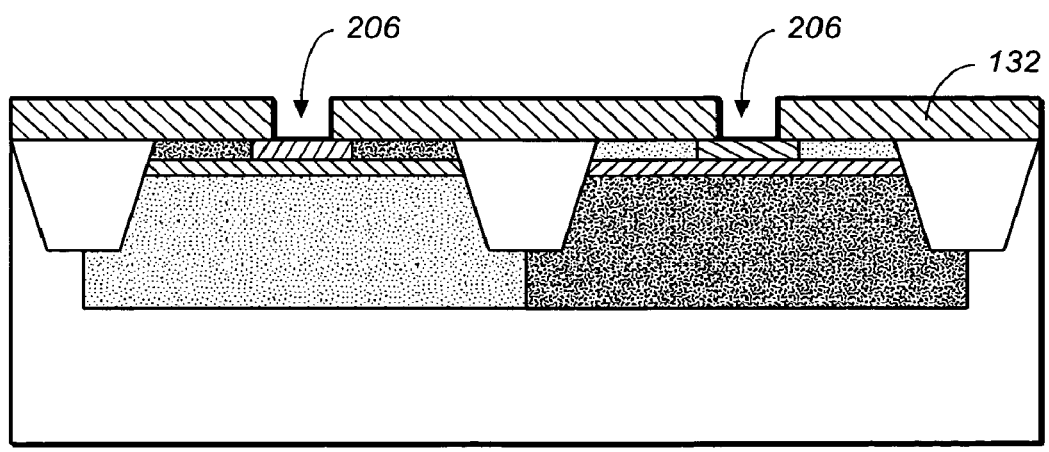
*FIG._2E*

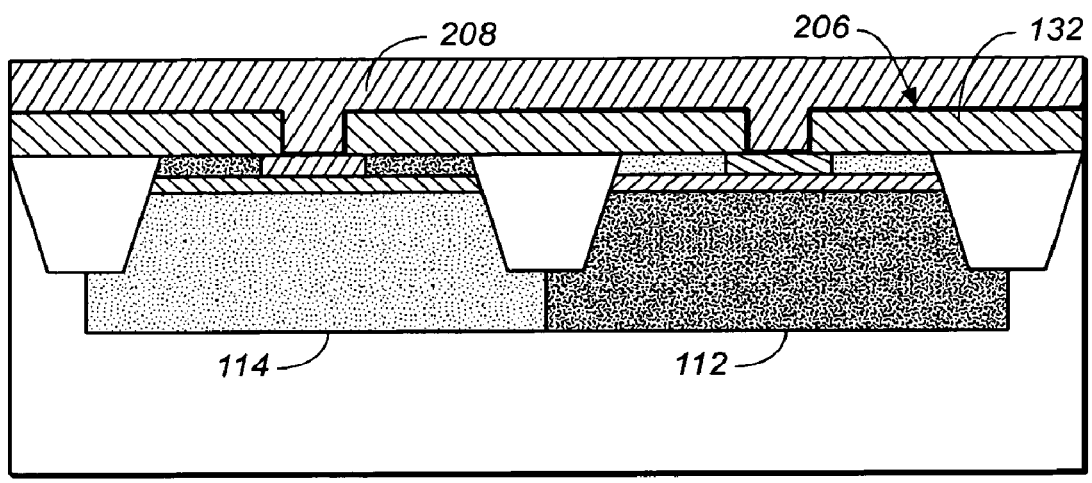
FIG._2F
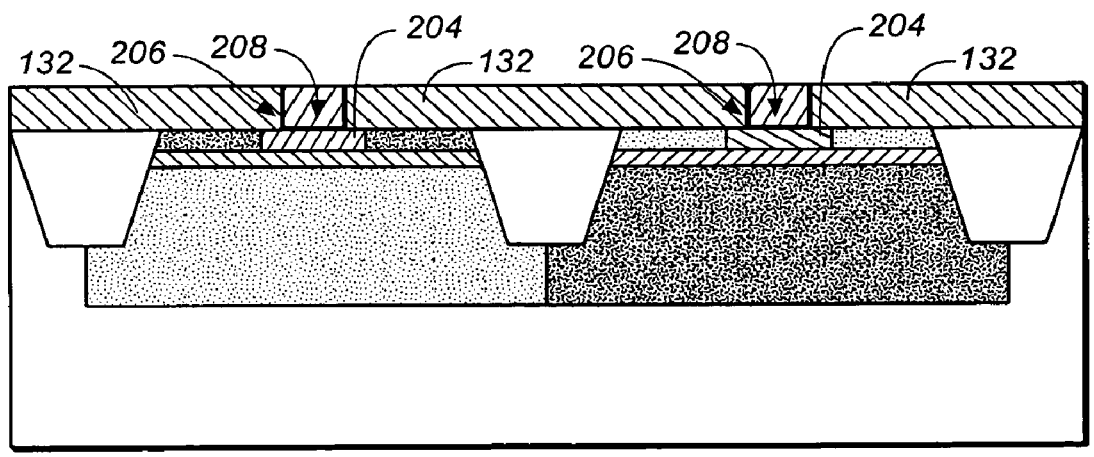
FIG._2G

SPACER-LESS TRANSISTOR INTEGRATION SCHEME FOR HIGH-K GATE DIELECTRICS AND SMALL GATE-TO-GATE SPACES APPLICABLE TO SI, SIGE AND STRAINED SILICON SCHEMES

CROSS-REFERENCE TO RELATED APPLICATIONS

This application is a Divisional application of prior U.S. application Ser. No. 10/791,337, entitled "SPACER-LESS TRANSISTOR INTEGRATION SCHEME FOR HIGH-K GATE DIELECTRICS AND SMALL GATE-TO-GATE SPACES APPLICABLE TO $S_I$, $S_IG_E$ AND STRAINED SILICON SCHEMES", filed Mar. 1, 2004, now abandoned, which is incorporated herein by reference.

BACKGROUND OF THE INVENTION

1. Field of the Invention

The present invention relates to methods for forming semiconductor transistors. More particularly, the present invention relates to methods for integrating high-k gate dielectric layers and gate electrodes in the transistor formation process.

2. Description of the Related Art

Designers and semiconductor device manufacturers constantly strive to develop smaller devices from wafers, recognizing that circuits with smaller features generally produce greater speeds and increased packing density, therefore increased net die per wafer (numbers of usable chips produced from a standard semiconductor wafer). To meet these requirements, semiconductor manufacturers have been forced to build new fabrication lines at the next generation process node (gate length).

However, with smaller devices several new problems have surfaced. For example, in the manufacture of Very Large Scale Integrated (VLSI) ultra-submicron technologies, the small technology node sizes require ultra high-k dielectric layers as well as very small gate-to-gate spacing. These structural requirements have in turn created problems preventing full implementation of these process technologies. For example, high-k gate dielectrics are sensitive to the high thermal cycles typically required to activate dopants and repair the damage from implantation steps. In addition, the ultra small spacing between gate electrodes requires heightened efforts in avoiding void formation during the transistor interlayer deposition.

With smaller spaces between adjacent gates, the gap-filing challenges increase dramatically. These challenges result from the tendency of dielectrics formed on a structure having at least one steep sidewall to produce voids from the effect of an overhang. That is, as a dielectric layer such as a primary layer dielectric (PMD) or other interlayer dielectric (ILD) is deposited, given a trench having a large enough aspect ratio, i.e., the height of the trench divided by the width, voids will tend to appear in the deposited dielectric layer. Typically, an overhang will be created at the one of the upper corners of the structure defining the trench.

At some point during the process of depositing the dielectric layer, the dielectric at the level of the overhang thickness from opposing sides of the trench will meet, thus in some cases encapsulating a void in the dielectric. As the spacing between adjacent gates decreases with the decrease in dimensions of the process technology nodes, the adjacent gates will present a trench structure to the interlayer dielectric film when it is deposited.

Much effort in process engineering is required to tune the process to avoid the formation of the void. Preventing void formation typically involves selecting the process parameters to control the overhang thickness relative to the dielectric thickness at the bottom of the sidewall of the trench and controlling the trench width. But the latitude available to the designer to alter the process parameters or the trench dimensions to mitigate void formation problems decreases as process technology nodes decrease in size.

Accordingly, what is needed is an improved process for forming ultra small transistors, one that overcomes the low thermal budgets of the conventional process and its tendencies to produce voids between adjacent gate electrodes.

SUMMARY OF THE INVENTION

To achieve the foregoing, the present invention provides transistor integration schemes that avoid the potential damage to high-k gate dielectric layers caused by high thermal cycles and also reduces or eliminates the problematic formation of voids in the dielectric layers filling the gaps between adjacent gates. The novel integration scheme deposits an interlayer-dielectric film prior to the gate electrode formation to avoid the demanding gap fill requirements presented by adjacent gates. A trench is formed in the ILD followed by the formation of the gate dielectric and gate electrode in the trench. Thus, the gate is formed by a damascene method.

A second ILD layer is formed after formation of the gate electrode to protect the gate electrodes during a chemical mechanical polishing step directed to the formation of contacts. By forming the gate electrode by the damascene method described, the first ILD layer is used in lieu of a spacer to surround the gate electrode. This allows greater flexibility in choosing the first ILD layer to be a different material than the second ILD layer.

Moreover, forming the gate electrode in the etched trench allows greater flexibility in choosing the gate conductor material. Patterning the gate electrode by an additive process frees up the gate electrode to be formed from a material not limited by the etching chemistry constraints of the gate electrode and adjacent layers.

According to one embodiment of the present invention, a method of forming a transistor gate electrode is provided. A dielectric layer is formed directly on a semiconductor substrate, the substrate having an implanted source and drain region. A trench is then formed in the dielectric layer. A conformal second dielectric layer is deposited to line the trench, thus forming a gate dielectric. A gate conductor material is then deposited to fill the trench.

According to another embodiment, a method of forming an integrated circuit transistor is provided. Source and drain regions for the transistor are defined in the substrate prior to the formation of the gate electrode. After the source and drain regions are defined, a dielectric layer is formed on the substrate and patterned to form a trench. First, a high-k dielectric film is disposed in the trench to line the trench. Then, a gate conductive layer is formed by filling in the trench, the gate conductive layer being configured to form a gate electrode for controlling current flow between the source and drain regions. Formation of the gate electrode is completed by chemical mechanical polishing.

According to another embodiment, a method of forming an integrated circuit transistor is provided. Source and drain regions for the transistor are defined in the substrate prior to the formation of the gate electrode. After the source and drain regions are defined, a dielectric layer is formed on the substrate and patterned and etched to form a trench. Etching of the trench continues until a channel region is etched in the substrate. The channel region is then filled with a channel material, preferably by epitaxial growth. This scheme allows for control of the channel characteristics using silicon or silicon germanium. Next, a high-k dielectric film is disposed in the trench to line the trench. Then, a gate conductive layer is formed by filling in the trench, the gate conductive layer configured to form a gate electrode for controlling current flow between the source and drain regions. Chemical mechanical polishing completes formation of the gate electrode.

These and other features and advantages of the present invention are described below with reference to the drawings.

BRIEF DESCRIPTION OF THE DRAWINGS

FIGS. 1A-1O are diagrams illustrating a method of forming a semiconductor integrated circuit in accordance with one embodiment of the present invention.

FIG. 2A-2G are diagrams illustrating a method of forming a semiconductor integrated circuit in accordance with an alternative embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

FIGS. 1A-1O are diagrams illustrating a method of forming a semiconductor integrated circuit in accordance with one embodiment of the present invention. It should be noted that in each sequence of drawings provided herein, reference numbers identified earlier in the sequence apply to those same elements in other drawings of the sequence unless otherwise noted or the context otherwise dictates.

The process begins as illustrated in FIG. 1A with an isolation trench 104 or other isolation structure formed on a semiconductor substrate 102. Isolation trenches may be formed by conventional steps, well know to those of skill in the relevant art. For example, a conventional shallow trench isolation typically involves depositing an oxide layer on the surface of a semiconductor substrate, followed by deposition or formation of a nitride layer that is patterned to act as a mask for shallow trench etch. The nitride mask also has a role as a proper in-situ control layer for CMP, and preventing further oxidation of the substrate surface where it is masked. The next step involves etching of the shallow trench followed by formation of an oxide liner in the shallow trench. Following trench formation, the trenches are typically cleaned using combinations of conventional dry and wet chemistry and the trench side walls oxidized to form a liner, typically a few hundred Angstroms thick, to repair any damage caused by the plasma used in etching the trench. This oxide liner also provides a base for the subsequent insulation deposition.

Following formation of the oxide liner, the trench is filled with deposited oxide. For example, the trench may be filled with a silicon dioxide layer, deposited by chemical vapor deposition (CVD), high-density plasma (HDP) deposition, or spin-on glass (SOG), on the integrated circuit substrate 102. The partially formed device is then subjected to chemical mechanical polishing (CMP) and planarized down to a top surface comprising the top of the trench 104 and to the top of the substrate layer 102 adjacent to the trench 104. The isolation regions are important for electrically isolating active areas formed in the substrate 102 from each other.

As shown in FIG. 1A, after the insulating layer, i.e., the trench oxide, is polished using chemical mechanical polishing means, the nitride layer stripped and the oxide residue removed using an HF cleaning step, the surface 108 of the insulating layer at the top of the trenches 104 is substantially planar. After the isolation structures shown in FIG. 1A are formed, the fabrication process proceeds to forming features of active areas, e.g., transistor devices.

In complementary MOS (CMOS) technology, an NMOS transistor and a PMOS transistor are fabricated adjacent to each other on the same substrate, which may initially be lightly doped or undoped. Circuits made from CMOS devices require less power and generate less heat than equivalent circuits designed with NMOS or PMOS devices alone. This embodiment of the present invention illustrates the transistor formation process as implemented in a CMOS device. It should be appreciated, however, that the scope of the present invention is not so limited. That is, the techniques described herein are applicable to the formation of gates and gate dielectric layers in any transistors utilizing these features, including the full variety of MOS field effect transistors, such as PMOS and NMOS transistors.

In order to form the CMOS transistor, first and second wells of n type and p type, respectively, are formed in the substrate by conventional process steps. That is, one or more PMOS transistors are formed in the n type well, and one or more NMOS transistors are formed in the p type well. PMOS and NMOS transistors are paired together to create the CMOS device having the advantages described above, further including very low standby current consumption.

The device formation proceeds with the well formation, as illustrated in FIG. 1B. In specific, the transistor integration process of the first embodiment continues by next implanting the p- and n-wells using n-well and p-well masks on the corresponding sides of the isolation trench. The respective wells are formed by conventional doping methods well known to those of skill in the art. For example, the n-well mask formation is followed by an n-well implant to form the n-well region 114 in the area of the substrate exposed under the n-well mask (not shown). Suitable n-type dopants used for formation of the well include phosphorus. In order to repair the damage from the ion implantation, an n-well anneal step preferably follows the implantation, as is done typically following the conventional well formation steps. In turn, a p-well mask is formed on the wafer, followed by a p-well implant into the areas exposed by the mask, i.e., into the p-well region 112. The respective wells may be formed using conventional dopants. The most commonly used dopant species for p- and n-wells are boron and phosphorus, respectively. The p-well and n-well dopings form a p-n junction 110 under the field oxide of adjacent n+ and p+ diffusion regions 114 and 112. It is important for the device operation that these two diffusion regions (devices) are clearly electrically separated. A p-well anneal step follows. Since the post well anneal steps are well known to those of skill in the relevant art, further description is deemed unnecessary here.

Next, as illustrated in FIG. 1C, the lightly doped drain (LDD) regions are formed in the respective wells. These are also known as lightly doped diffusions. In this step and many of the other steps of the embodiments of the invention, the n-type doping is described as occurring prior to the p-type doping. It will be appreciated by those of skill in the relevant arts that the order of the n-type and p-type doping can be interchanged without adversely affecting the formed device. Thus the scope of the present invention is intended to include the respective p-type and n-type doping without limitation to the particular order of the dopants for a particular step in the process. Hence, the p-type dopants can alternatively be introduced into the n-well to form the p-LDD regions before formation of the n-LDD regions in the p-well.

The embodiments of the present invention form drain engineering prior to the formation of the gate electrode. In particular, the lightly doped drain implants as well as punch through stop layer and source and drain definition all occur prior to the building of the building of the gate electrode. Although these implants are not self-aligned, they provide substantial advantages in thermal cycle engineering. That is, masking is used in formation of the LDD, punch through, and source/drain definition implants. In particular, for each well, a first well mask is used for formation of a subsequent LDD and punch through implant for that well. After these regions are formed in each well, a separate source/drain mask is used for each well in order to form the more heavily doped source and drain regions. As well known to those of skill in the art, LDD regions are used to protect against hot electron effects whereas punch through implants protect against breakdown mechanism caused by the overlap between the source and drain depletion regions.

The drain engineering commences with the LDD implant, as illustrated in FIG. 1C. The scope of the invention is intended to extend to any of the conventional techniques for implanting lightly doped diffusions, punch through implants, and source or drain regions. Preferably, ion implant procedures are used to implant the respective portions of the substrate to create these diffusion regions in the substrate 102. Initially, a p-well mask is formed to cover the n-well 114 and to expose portions of the p-well 112. Next, a lightly doped drain implant occurs. Preferably, the LDD implant 120 of n-type dopants (into the p-well 112) includes n-type dopant ions in a suitable concentration in accordance with the process technology node dimensions and the particular type of dopants used. These dopants and concentrations are expected to conform to those used in conventional process steps and adjusted in accordance with the desired depth of the implant, the type of dopant, and the presence or absence of overlying sacrificial layers. For example, without intending to be limiting, a suitable n-type dopant implantation at the 0.18 micron technology node involves a dosage range of 1 to $10 \times 10^{13}$ cm$^{-2}$ of phosphorus ions.

After formation of the LDD implant 120 in the p-well 102, a punch through stop implant 122 is formed. Suitable concentrations of dopants are known to those of skill in the art and therefore will not be described in complete detail here. A suitable n-type punch through stop implant at the same technology node could use phosphorus ions or any other n-type ion at any appropriate dosage determined by methods known to those of skill in the art. The depth of the punch through stop implant is controlled such that the punch through implant region is buried in the substrate 102 at a predetermined depth in accordance with conventional techniques.

Next, annealing occurs to repair the damage to the crystalline structure from the n-type implant and to activate the dopants. Annealing of the LDD and punch through regions preferably occurs in conformance with conventional techniques known to those of skill in the relevant art. Further details are deemed unnecessary here. As noted above, annealing takes place at very high temperatures, e.g., 1000 to 1200 degrees C. Performing the annealing before the formation of the gate and gate dielectrics allows for the control of the thermal budget during the high-k dielectric formation and subsequent gate electrode processing that may include the use of low melting point temperatures (e.g., Tungsten).

Following formation of the LDD and punch through implants in the p-well 112, the process proceeds to form similar implants in the n-well 114. That is, using an n-well mask, a p-type LDD implant 116 and p-type punch through implant 118 are formed in the n-well 114. Suitable concentrations of dopants are known to those of skill in the art and therefore will not be described in complete detail here. Typically another anneal is not necessary, since the high-k thermal processing may be used to activate the P-type dopants.

Next, the source and drain regions are defined for each transistor. First, as illustrated in FIG. 1D, the formation of a p source-drain mask 124 is then followed with a p-type source-drain implant 126 into the n-well 114. Following the p-type source drain implant 126, the n source-drain mask 128 is formed to expose the appropriate region for the n-type source drain implant 130. That is, the n-type source-drain implant 130 is formed in the p-well 112 as specifically illustrated in FIG. 1E. The n-type source-drain mask 128 is patterned such that the portion of the substrate positioned under the predetermined location for the gate of the NMOS transistor is protected by the mask 128. Suitable dopants for implantation into the n-well source and drain regions are known to those of skill in the relevant arts and thus further description here is deemed unnecessary.

It will be appreciated that further annealing is required to restore the substrate silicon structure after the source drain implant. Preferably, the annealing of this region occurs during the high temperatures provided during the high-k gate dielectric layer deposition. Alternatively, a separate anneal step may be performed after formation of both of the source and drain regions in both of the p-wells and n-wells.

The present invention embodiments described rely on the deposition of a dielectric material on the substrate to form the gate by an additive damascene process. In particular, and as illustrated in FIG. 1F, an inter-layer dielectric (ILD) layer 132 is preferably deposited to a thickness in the range of 1000 to 3000 Angstroms, more preferably 1600 to 2500 Angstroms. Although these ranges are preferable, the invention scope is not so limited. The thickness of the deposited ILD layer 132 may be selected to whatever thickness is deemed suitable in consideration of the design and materials used for the dielectric. Preferably, the dielectric layer comprises one of undoped silicate glass (USG) or phospho-silicate glass (PSG). Although the inventive process has been described for illustration purposes as including PSG or USG, the invention is not so limited. The scope of the invention is intended to extend to any dielectric material that can be suitably deposited or formed and etched to form a trench. That is, any dielectric layer that can be deposited on the substrate and patterned and etched to form gate electrode trenches. In other words, as long as the dielectric material exhibits suitable selectivity to the etchant chemical used for forming the trench and, within a broad range of suitable electrical characteristics, it may be used for forming the trench.

Next, as illustrated in FIG. 1G, the dielectric (ILD) layer 132 is patterned by conventional photolithography, using a patterned resist layer to etch the ILD layer 132. The ILD layer is etched to form an electrode trench 134 at the locations specified for the transistor gates. These materials have been conventionally used for forming pre-metal dielectrics (PMD's). As known to those of skill in the relevant arts, PSG provides several advantages including an ability to readily reflow.

The etching of the gate electrode trench 134 is preferably performed using a fluorine based anisotropic dry etch, for example, either $C_2F_6$ or $CF_4$. Etching of the ILD layer 132 to form the gate electrode trench 134 may be performed using etching chemicals and techniques suitable for conventional contact hole etches. Etching preferably is performed to a depth that exposes the substrate 102. The width of the trench is dependent upon the particular process node involved in the fabrication.

Next, as illustrated in FIG. 1H, the gate dielectric formation process commences. Initially, a relatively thin high-k dielectric layer 136 is deposited. Many suitable high-k layers are known in the art to include zirconium oxides and multi layered laminates. Preferably, the thickness of the high-k layer could be any thickness and still fall within the scope of the invention. It should be understood that as with the conventional process, the thickness of the high-k dielectric layer is dependant on the desired electrical characteristics for the device and the characteristics of the dielectric gate material, specifically including the permittivity k of the gate dielectric material. By depositing the dielectric film in this damascene manner, the thickness of the high-k layer is well controlled. Further, by depositing the high k gate dielectric layer and the subsequently formed gate after implantation of the source and drain regions, the thermal budget for the device can be increased. In other words, using the described fabrication sequence of this embodiment, neither the high-k dielectric layer nor the gate conductor are in place during the high temperatures required to anneal the source, drain and other implants.

Next, as illustrated in FIG. 1I, a gate electrode conductive material 138 is deposited to fill the trench 132 and to create an overburden region. The gate electrode conductive material 138 can comprise any conductive material such as including but not limited to Cu, W, and Al. Doped polysilicon may be used for the gate electrode as well. The doped poly gates are used in the conventional transistor fabrication steps in part due to their low surface state densities that makes them suitable for exposure to the high temperatures present during annealing. Because neither the gate electrode not the high-k gate dielectric layer are present during annealing, the range of conductive materials used for the gate electrode in the described embodiments of the present invention are much greater. For example, aluminum oxidizes readily during annealing conditions but can readily be used in the presently described process since the formation of the gate conductive layer occurs after the annealing steps.

After deposition of the gate electrode layer 138, chemical mechanical polishing is preferably performed to remove the overburden region and thus to planarize the gate electrode 138 to be coplanar with the top surface of the dielectric layer 132. The partially formed device after completion of the planarization step is illustrated in FIG. 1J.

In order to form contacts for electrical connection to the device, a second ILD deposition step then follows, as shown in FIG. 1K. The second ILD layer 140 may comprise any suitable dielectric layer such as an oxide and also may comprise the same constituency as the first ILD layer 132. Preferably, the second ILD layer 140 has a thickness in a range on the order of 5000 Angstroms. However, the dimensions of the second ILD layer 140 are process dependent. The second ILD layer 140 may be formed by conventional techniques known to those of skill in the art including chemical vapor deposition (CVD) methods. The second ILD layer is deposited after the gate electrode is formed to protect the gate electrode during the contact conductor chemical mechanical polish step. The use of a second ILD layer for contact formation and CMP protection allows flexibility in choosing the first ILD material. For example, nitrides are not conventionally used in forming the dielectric surrounding the gate electrode (e.g., the pre-metal dielectric) due to their tendencies to damage the surface of the substrate. By forming a second ILD layer on top of the first, the substrate can be protected from a nitride or other similar dielectric present in the second ILD layer, yet providing the passivation advantages of the nitride containing second ILD.

Next, as illustrated in FIG. 1L, the second ILD layer 140 is etched to form contact holes 142 and gate contact holes 144. Typical diameters for these holes range from 0.14 to 0.25 microns, but again, the sizes are process technology node dependent. Conventional etching chemicals and techniques for forming the contact holes can be used to form the holes for the contacts and gate contacts. Accordingly, further details are deemed unnecessary here.

Next, as further illustrated in FIG. 1M, salicide layers 146 are formed at the bottom of the contact holes 142 and on top of the gate electrode 144. Salicides may preferably be formed by CVD, atomic layer deposition (ALD), or plasma enhanced chemical vapor deposition (PECVD) means to flow into and suitably fill the contact holes. CVD processes used in depositing and forming cobalt or nickel salicides are known in the relevant arts and thus further details are deemed unnecessary here. In particular, the CVD process may be appropriately adjusted to suit the deposition of salicide materials in the bottom portions of contact holes and other high aspect ratio apertures. As known in the relevant arts, salicide formation provides the advantages of low ohmic contacts.

In order to complete the contact formation, a contact metal 148 such as Cu or W is deposited to fill the contact holes, as further illustrated in FIG. 1N. These materials are intended to be illustrative and not limiting. The scope of the invention is intended to extend to any contact materials conventionally used or proposed in the future. As illustrated in FIG. 1P, a CMP step planarizes the top surface of the device.

Although the described method does not perform a self-aligned implant of the source and drain regions, alignment problems can be effectively controlled by preferably restricting alignment in one of two directions. That is, alignment concerns can be limited to only one direction since the critical dimensions for gate electrodes refer to the width of the gate.

The damascene methods for forming the gate and gate dielectric film enable the formation of an epitaxial silicon layer for the channel region of the transistor. That is, according to a second embodiment, rather than stopping the trench etch on the silicon substrate as in the first embodiment, the trench etch is extended partially into the silicon substrate. The etched trench extension into the substrate, i.e., the channel etch, is then filled with epitaxial silicon by a deposition technique, for example, by chemical vapor deposition methods. Following the growth of the epitaxial silicon portion, the trench is lined with a thin high-k gate dielectric film followed by deposition of the gate conductor material, as described above in the first embodiment. This embodiment thus provides a transistor capable of higher performance due to the formation of the inversion channel in the epitaxial silicon portion. In the second embodiment, the implanted epitaxial silicon is implanted to form strained silicon in the channel. The strained Si can be integrated onto Ge or SiGe. By creating the gate electrode and high-k dielectric film by this additive process, advanced characteristics can be obtained suitable for the next generations for CMOS architectures.

FIGS. 2A-2G are diagrams illustrating a method of forming a semiconductor integrated circuit in accordance with a second embodiment of the present invention. This embodiment describes a process flow including an epitaxial grown channel portion. The steps illustrated in FIGS. 2A to 2G may alternatively be integrated into the process flow described and illustrated in FIGS. 1A to 1N, preferably in lieu of FIGS. 1F to 1J. That is, after definition of the source/drain implants illustrated in FIG. 1E, the process flow proceeds to the gate electrode trench etch illustrated in FIG. 2A. Once the gate electrode in accordance with the second embodiment is formed, contact hole and contact formation proceeds as illustrated in FIGS. 1K to 1N.

Initially, as illustrated in FIG. 2A, the first ILD layer 132 is formed on the substrate 102 for subsequent patterning and etching. As illustrated in FIG. 2B, the gate electrode trench is defined in the first ILD layer 132 as described above with reference to FIG. 1G. Rather than stopping on the surface of the substrate 102 as described in the first embodiment, the etching continues into the substrate 102 to etch a channel 202 into the substrate, as illustrated in FIG. 2C. The depth of the channel etch can vary in accordance to the design but preferably is a sufficient depth such that the entire device inversion channel forms in the subsequently epitaxially grown region.

Next, as illustrated in FIG. 2D, epitaxial growth of the device channel 204 occurs. The epitaxially grown channel 204 may be grown as strained Si on Ge or on Si—Ge. Strained silicon is achieved by incorporating Ge in the Silicon lattice. A primary advantage is controlling the characteristics of the channel with more precision. Impurities may be added to modify the conductivity or stress of the channel to achieve different modes of operation for the transistor.

In essence, this embodiment enables the rebuilding of a pure channel to meet the demanding requirement of future device technologies. Due to the limitations of the base Si substrate material, particularly in terms of carrier mobility and intrinsic performance, efforts have been directed to substituting other materials for conventional silicon substrate. Strained Si technology enables improvements in CMOS performance and functionality through replacement conventional Si substrate with a biaxially strained thin Si film at the surface. The strained Si film has electrical properties superior to bulk Si. For example, these characteristics include greater electron and hole mobilities. Silicon in its strained state provides greater drive current capabilities for NMOS and PMOS transistors.

Following formation of the epitaxially grown channel 204, deposition of the high-k gate dielectric 206 occurs (See FIG. 2E), again in accordance with the techniques and parameters described in the first embodiment with respect to gate dielectric 134. Next, a gate electrode conductive material 208 is deposited, preferably comprising polysilicon or tungsten, as illustrated in FIG. 2F. Additional specific candidates include Cu, W or Al as described earlier. This technique provides a choice of materials for the gate electrode. The process steps and parameters for depositing this gate conductive layer conforms to the methods of forming the gate electrode conductive layer 136 described and illustrated in FIG. 1I.

After deposition of the gate electrode conductive layer 208, chemical mechanical polishing is preferably performed to remove the overburden region and thus to planarize the gate electrode 208 to be coplanar with the top surface of the dielectric layer 208. The partially formed device after completion of the planarization step is illustrated in FIG. 2G. Formation of the contact holes and contacts then proceeds in accordance with the process steps illustrated and described in the first embodiment with reference to FIGS. 1K to 1N.

The present invention overcomes problems in the formation of gate electrodes and high-k gate dielectric films in ultra submicron process technologies. The novel sequencing provided in embodiments of the present invention form the high-k dielectric film and the gate electrode after the high temperature anneal processes have been completed. Lightly doped diffusion (LDD) regions are then formed in surface regions of the substrate. In conventional processes, they are self-aligned with the structure of the gate electrode, owing to the prior formation and patterning to the gate. The surfaces of the source drain regions and the gate electrode are then salicided to improve contact resistance. Since the salicides are formed after contact etch, improvements in device performance result form reduced transistor leakage. Specifically, the lack of salicide near the shallow trench isolation recess prevents related transistor leakage due to the salicide crossing the bent junction in these regions.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming an integrated circuit transistor comprising:
   providing a substrate with a doped well transistor region, the well having formed thereon a lightly doped diffusion (LDD) layer having an underlying and immediately adjacent punch through stop layer, the LDD layer defining a top plane for the substrate;
   selectively forming gate, source, and drain regions from the LDD layer such that that the gate region is formed in the LDD layer;
   depositing a first dielectric layer on the substrate including said gate, source, and drain regions;
   etching a gate electrode trench in the first dielectric layer such that said trench exposes the gate region, said etching comprises etching through the first dielectric layer and removing material from the underlying gate region of the LDD layer to form an opening that extends below the top plane of the substrate;
   replacing the material removed from the opening in the gate electrode trench with an epitaxially grown channel;
   depositing a conformal gate dielectric film to line the trench such that it includes forming the conformal gate dielectric film on the epitaxially grown channel; and
   depositing a gate electrode conductor in the trench to cover the gate dielectric film and fill the trench.

2. The method as recited in claim 1 wherein the gate electrode trench etch stops on the underlying substrate.

3. The method as recited in claim 1 wherein the first dielectric layer comprises one of undoped silicate glass and phospho-silicate glass.

4. The method as recited in claim 1 wherein the gate electrode conductor comprises aluminum.

5. The method as recited in claim 1 wherein the gate electrode conductor comprises one of aluminum, tungsten, and polysilicon.

6. The method as recited in claim 1 further comprising defining a drain and source region in the substrate before depositing the first dielectric layer on the substrate.

7. The method as recited in claim 1 wherein the first dielectric layer is an interlayer dielectric and further comprising forming at least one contact hole in the first interlayer dielectric.

8. The method as recited in claim 7 wherein the at least one contact hole exposes at least one of a source, a drain, or a gate electrode and further comprising forming a salicide on the exposed at least one of a source, a drain, and a gate electrode.

9. The method as recited in claim 1 wherein the epitaxially grown channel comprises a strained silicon layer formed on a SiGe layer grown in the channel trench.

10. The method as recited in claim 1 wherein the epitaxially grown channel comprises a strained silicon layer formed on a Ge layer grown in the channel trench.

11. The method as recited in claim 10 wherein the epitaxially grown channel comprises a strained silicon layer formed on one of a SiGe or Ge layer.

12. The method as recited in claim 1 wherein depositing the first dielectric layer comprises depositing a dielectric material that comprises depositing a non-nitride dielectric material.

13. The method as recited in claim 12 further comprising depositing on the first dielectric layer and gate electrode conductor, a second dielectric layer that includes nitride containing materials, thereby forming a second dielectric layer.

14. The method as recited in claim 13 further including etching openings in the first and second dielectric layers to expose the gate electrode conductor and said source and drain regions.

15. The method as recited in claim 14 further including salicide layer formation at the bottom of the openings associated with said gate electrode and said source and drain regions.

16. The method as recited in claim 13 further including the forming of conductive contacts in the openings to provide electrical connection with the gate electrode conductor and said source and drain regions.

17. The method as recited in claim 13 further including,
etching openings in the first and second dielectric layers to expose the source and drain regions; and
forming salicide layers at the bottom of the openings associated with said source and drain regions such that the salicide layers extend below the top plane of the LDD layers of the source and drain regions.

18. The method as recited in claim 1 wherein an annealing step is introduced and performed prior to said depositing of the conformal gate dielectric film to line the trench and prior to said depositing of the gate electrode conductor.

19. The method as recited in claim 1 wherein the selectively forming of the gate, source and drain regions comprises, implanting dopant materials into the LDD layer such that gate region and the doped source and drain regions are coplanar within the LDD layer.

20. The method as recited in claim 1 wherein providing a substrate with a doped well transistor region further comprises providing a substrate where the lightly doped diffusion (LDD) layer extends completely across the doped well transistor region.

21. The method as recited in claim 1 wherein
providing a substrate with a doped well transistor region, the well having formed thereon a lightly doped diffusion (LDD) layer having an underlying and immediately adjacent punch through stop layer, the LDD layer defining a top plane for the substrate;
selectively forming gate, source, and drain regions from the LDD layer such that that the gate region is formed in the LDD layer;
depositing a first dielectric layer on the substrate including said gate, source, and drain regions;
etching a gate electrode trench in the first dielectric layer such that said trench exposes the gate region;
depositing a conformal gate dielectric film to line the trench;
depositing a gate electrode conductor in the trench to cover the gate dielectric film and fill the trench; and
after the deposition of the conformal gate dielectric film to line the trench and after the deposition of the gate electrode conductor in the trench, performing the operation of depositing a second dielectric layer that covers the gate electrode conductor wherein the second dielectric layer comprises a nitride containing dielectric material.

* * * * *